United States Patent
Tanaka

(10) Patent No.: US 7,550,829 B2
(45) Date of Patent: Jun. 23, 2009

(54) ELECTRONIC PACKAGE AND SEMICONDUCTOR DEVICE USING THE SAME

(75) Inventor: Takekazu Tanaka, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 24 days.

(21) Appl. No.: 11/892,093

(22) Filed: Aug. 20, 2007

(65) Prior Publication Data

US 2008/0001265 A1    Jan. 3, 2008

Related U.S. Application Data

(63) Continuation of application No. 11/168,934, filed on Jun. 29, 2005, now Pat. No. 7,274,090.

(30) Foreign Application Priority Data

Jun. 30, 2004  (JP)  ............................. 2004-193003

(51) Int. Cl.
*H01L 23/495*  (2006.01)

(52) U.S. Cl. ............................. 257/676; 257/E23.043

(58) Field of Classification Search .................. 257/676
See application file for complete search history.

(56) References Cited

U.S. PATENT DOCUMENTS

| | | | |
|---|---|---|---|
| 5,281,849 | A  | 1/1994  | Singh Deo et al. |
| 6,633,077 | B2 | 10/2003 | Ogata et al. |
| 6,787,392 | B2 | 9/2004  | Quah |
| 6,891,256 | B2 | 5/2005  | Joshi et al. |
| 2004/0201081 | A1 | 10/2004 | Joshi et al. |
| 2004/0207054 | A1 | 10/2004 | Brown et al. |
| 2004/0212053 | A1 | 10/2004 | Koh et al. |
| 2005/0133893 | A1 | 6/2005  | Joshi et al. |

FOREIGN PATENT DOCUMENTS

JP          2004-40008        2/2004

*Primary Examiner*—Victor A Mandala
*Assistant Examiner*—Krista Soderholm
(74) *Attorney, Agent, or Firm*—McGinn IP Law Group, PLLC

(57) ABSTRACT

A package for an electronic component including a chip mounting area mounting a semiconductor chip in a hollow part of a metal plate and a plurality of connection electrodes to be connected to a substrate. The plurality of connection electrodes are formed in opposite sides of the rectangular metal plate and arranged asymmetrically with respect to a perpendicular bisector of the opposite sides.

13 Claims, 10 Drawing Sheets

RELATED ART

RELATED ART

RELATED ART

ELECTRONIC PACKAGE AND SEMICONDUCTOR DEVICE USING THE SAME

The present Application is a Continuation Application of U.S. patent application Ser. No. 11/168,934, filed on Jun. 29, 2005 now U.S. Pat. No. 7,274,090. With respect to the prior co-pending U.S. application Ser. No. 11/168,934, this Continuation Application incorporates the claim of priority from Japanese Application No. 2004-193003, filed on Jun. 30, 2004, and claimed under 35 U.S.C. § 119. The present Application is assigned of record to NEC Electronics Corporation at Reel 016887 and Frame 0954.

BACKGROUND OF THE INVENTION

1. Field of the Invention

The present invention relates to electronic packages and semiconductor devices using the same and, particularly, to a package for an electronic component made of a rectangular metal plate and a semiconductor device using the same.

2. Description of Related Art

Electronic circuits having a semiconductor device are required to reduce the size of each electronic package in order to meet the recent demand for higher integration. Chip Scale Package (CSP) technology has been proposed to reduce the package size of semiconductor devices.

Japanese Unexamined Patent Publication No. 2004-40008 describes an example of the CSP semiconductor device. FIG. 8 is the perspective view of this semiconductor device and FIG. 9 is a perspective view of the structure when mounting the semiconductor device to a substrate. As shown in FIGS. 8 and 9, the semiconductor device has a semiconductor chip 109 which is mounted to an inner base part 102 of a metal base 103. The semiconductor chip 109 has a gate electrode 111a and a source electrode 111b on its surface. The metal base 103 has U-shaped both side parts 105 which are opposed to each other. A plurality of drain connection electrodes 104 are formed in the ends of the U-shaped parts. The chip mounting part (base part) 102 of the metal base 103 is designed to be slightly larger than the semiconductor chip 109.

As shown in FIG. 9, the semiconductor device is soldered to a substrate 130 in a face-down configuration. If the soldering areas of the surface electrodes 111a and 111b and the soldering areas of the connection electrodes 104 are significantly different from each other or they are arranged off-balance, for example, a great difference occurs in the force generated by soldering surface tension, soldering stress, and soldering thermal expansion. This causes displacement in mounting position or breakdown.

When solder is heated to reflow, it is melted and thereby surface tension occurs. The surface tension increases in proportion to the size of the mounting area to be soldered and acts toward the center of the mounting area. Therefore, a difference in surface tension occurs due to a difference in area size or arrangement balance. Further, when the solder is cooled after heating, it hardens and stress which is similar to the surface tension which has occurred during heating is left in the solder, and thereby breakdown is likely to occur due to a difference in stress. Furthermore, when the semiconductor device is heated after mounting by operation or environment, the substrate, metal base, semiconductor chip are thermally expanded and the solder is stressed due to a difference in the coefficient of thermal expansion and thus subject to breakdown.

To avoid the above drawbacks, this conventional semiconductor device makes the soldering areas of the surface electrodes 111a and 111b and those of the connection electrodes 104 which are soldered to the substrate 130 substantially the same size, and disperses the surface electrodes 111a and 111b and the connection electrodes 104 properly. The fixation strength of the surface electrodes 111a and 111b to the substrate 130 and that of the connection electrodes 104 to the substrate 130 thereby substantially equal and balance out. No excess stress is thus left on the mounting areas of the surface electrodes 111a and 111b, thereby preventing the semiconductor device from breaking down due to stress.

FIG. 10 shows the structure of another conventional semiconductor device. This semiconductor device has a rectangular metal package base 103a which has a hollow where a semiconductor chip is to be mounted. An integrated connection electrode 104a is formed in the four sides 105a of the rectangular base. The metal package base 103a has a chip mounting area 102a where a semiconductor chip 109a having a maximum mount size which is slightly smaller than the chip mounting area 102a is mounted by soldering. The semiconductor chip 109a has a plurality of surface electrodes 111 on its surface, and a plurality of soldering bumps 112 on the surface electrodes 111. In this structure, the four sides of the semiconductor chip 109a are pulled in four directions by solder surface tension which occurs with four inner walls 114 of the hollow of the chip mounting area 102a in the metal package base 103a and balance out, thereby providing stable positional accuracy.

In this way, when mounting the semiconductor chip with a maximum mount size to the semiconductor device of FIG. 10, the mounting position can be fixed by self-alignment. However, when mounting a semiconductor chip which is smaller than the maximum mount size to the center part of the chip mounting area 102a, it is difficult to obtain the mechanical positional accuracy of ±50 μm or below. It is also difficult to accurately fix the semiconductor chip to a given center position of the chip mounting area 102a since the chip moves in the flowing direction of solder. For example, if one direction of the semiconductor chip is the width direction and when mounting the semiconductor chip whose size in the width direction is the same as that of the semiconductor chip of the maximum mount size and whose size in the length direction perpendicular to the width direction is about half of the maximum mount size, mounting the semiconductor chip in the center part of the chip mounting area 102a results in that the semiconductor chip moves in the length direction due to the flowing solder which has been melted by heating, thus failing to obtain high positional accuracy.

On the other hand, when mounting the semiconductor chip against the end of the side of the chip mounting area 102a which is parallel to the width direction, the three sides of the semiconductor chip are pulled by the surface tension which occurs with the three inner walls 114 of the chip mounting area 102a and balance out. It is thereby possible to obtain high mounting position accuracy of the semiconductor chip as is the case when mounting the semiconductor chip of the maximum mount size.

In this way, the conventional semiconductor device is capable of obtaining high mounting position accuracy even if the semiconductor chip is shorter in the length direction by mounting the three sides of the semiconductor chips in near proximity to the three inner walls of the chip mounting area in the metal package base. However, the following problems still remain. If the semiconductor device where the semiconductor chip with half the length is face-down mounted to a substrate, a total of the soldering areas of the four connection electrodes which are soldered to the substrate is significantly larger than a total of the soldering areas of the plurality of surface electrodes. This makes a great difference in fixation strength to the substrate between the surface electrodes and the connection electrodes. Further, the soldering areas of the plurality of surface electrodes are arranged asymmetrically, disproportionately to one side, with respect to the soldering areas of the four connection electrodes, compared to the case of mounting the semiconductor chip of the maximum mount size.

This makes a great difference in the force generated by soldering surface tension, soldering stress and soldering thermal expansion between the mounting areas of the connection electrodes and those of the surface electrodes, causing displacement in mounting position or breakdown.

SUMMARY OF THE INVENTION

According to one aspect of the invention, there is provided a package for a electronic component, formed using a rectangular metal plate, which includes a chip mounting area for mounting a semiconductor chip in a hollow part of the metal plate, and a plurality of connection electrodes to be connected to a substrate, formed in opposite sides of the rectangular metal plate, and arranged asymmetrically about a perpendicular bisector of the opposite sides. The connection electrodes of the package and surface electrodes of a semiconductor chip to be mounted are placed in balance, thus reducing a difference in force between the connection electrodes and the front surface electrodes, which is generated during or after mounting. It is therefore possible to prevent mounting defect or breakdown from occurring even when mounting a semiconductor chip which is smaller than a maximum mount size.

According to another aspect of the invention, there is provided a package for a electronic component, formed using a rectangular metal plate and including a chip mounting area for mounting a semiconductor chip in a hollow part of the metal plate, and a plurality of connection electrodes to be connected to a substrate and formed in opposite sides of the rectangular metal plate. In this package, a total contact area between the plurality of connection electrodes formed at side of one part of the chip mounting area divided by a perpendicular bisector of the opposite sides and the substrate is smaller than a total contact area between the plurality of connection electrodes formed at side of the other part of the chip mounting area and the substrate. The connection electrodes of the package and surface electrodes of a semiconductor chip to be mounted are placed in balance, thus reducing a difference in force between the connection electrodes and the front surface electrodes, which is generated during or after mounting. It is therefore possible to prevent mounting defect or breakdown from occurring even when mounting a semiconductor chip which is smaller than a maximum mount size.

According to still another aspect of the invention, there is provided a semiconductor device which includes a semiconductor chip and a package for a electronic component. The package has a chip mounting area for mounting the semiconductor chip in a hollow part of a rectangular metal plate and a plurality of connection electrodes to be connected to a substrate and formed on opposite sides of the rectangular metal plate. In this semiconductor device, a distance between a connection electrode formed at side of one part of the chip mounting area divided by a perpendicular bisector of the opposite sides and the perpendicular bisector is shorter than a distance between a connection electrode formed at side of the other part of the chip mounting area and the perpendicular bisector, and the semiconductor chip is mounted so as to be shifted to the other part of the chip mounting area. The connection electrodes of the package and surface electrodes of a semiconductor chip to be mounted are placed in balance, thus reducing a difference in force between the connection electrodes and the front surface electrodes, which is generated during or after mounting. It is therefore possible to prevent mounting defect or breakdown from occurring even when mounting a semiconductor chip which is smaller than a maximum mount size.

According to yet another aspect of the invention, there is provided a semiconductor device which includes a semiconductor chip and a package. The package has a chip mounting area for mounting the semiconductor chip in a hollow part of a rectangular metal plate and a plurality of connection electrodes to be connected to a substrate and formed in opposite sides of the rectangular metal plate. In this semiconductor device, a total contact area between the plurality of connection electrodes formed at side of one part of the chip mounting area divided by a perpendicular bisector of the opposite sides and the substrate is smaller than a total contact area between the plurality of connection electrodes formed at side of the other part of the chip mounting area and the substrate, and the semiconductor chip is mounted so as to be shifted to the other part of the chip mounting area. The connection electrodes of the package and surface electrodes of a semiconductor chip to be mounted are placed in balance, thus reducing a difference in force between the connection electrodes and the front surface electrodes, which is generated during or after mounting. It is therefore possible to prevent mounting defect or breakdown from occurring even when mounting a semiconductor chip which is smaller than a maximum mount size.

The present invention provides a package for an electronic component and a semiconductor device capable of preventing mounting defect or breakdown from occurring even when mounting a semiconductor chip which is smaller than a maximum mount size.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

First Embodiment

Figure 1A:
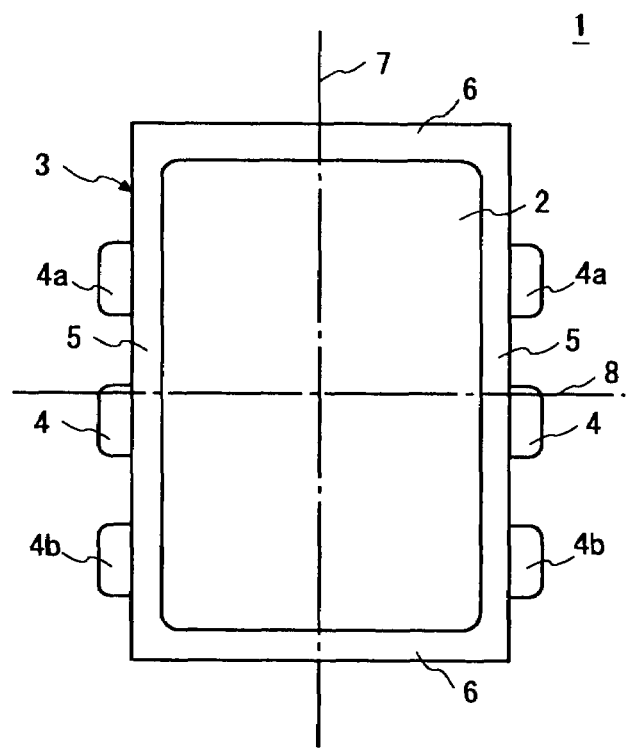
FIG. 1A is a plan view of a package for an electronic component of the present invention.
Figure 1B:
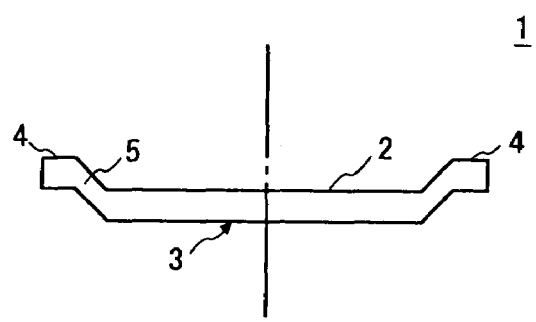
FIG. 1B is a sectional view of the electronic package of the present invention.

FIG. 1A is a plan view of a package for an electronic component 1, and FIG. 1B is a sectional view of the same. The package 1 is formed using a rectangular metal package base 3 which has a hollow chip mounting area 2. Connection electrodes 4 which are used as package electrodes to be connected to a substrate by soldering are formed in an opposite pair of sides 5 in the left and right of the rectangular base 3 in FIG. 1A and not formed in an opposite pair of sides 6 in the top and bottom of the same. A plurality of connection electrodes 4 are placed in each side 5 in such a way that they are arranged symmetrically with respect to a center line 7 of the left and right sides 5. In the example of FIG. 1, three connection electrodes 4 are placed in one side and another three connection electrodes 4 are placed in the other side in symmetrical positions, so that total six connection electrodes 4 are placed.

Figure 4A:
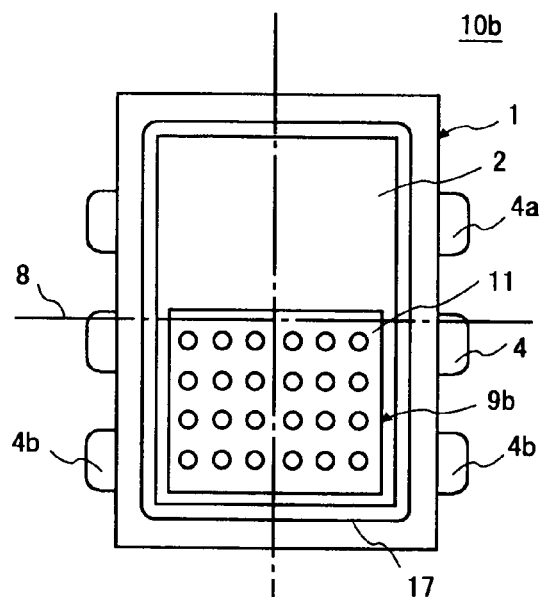
FIG. 4A is a plan view of a semiconductor device of the present invention.

The connection electrodes 4 are arranged asymmetrically about a perpendicular bisector 8 of the sides 5 where the connection electrodes 4 are formed. In the plan view of FIG. 4A, connection electrodes 4b which are placed in the lower part in FIG. 4A are placed farther apart from the perpendicular bisector 8 than connection electrodes 4a which are placed in the upper part in FIG. 4A.

A semiconductor chip which is smaller than a maximum mount size is mounted in the area lower than the perpendicular bisector 8 in the chip mounting area 2. Thus, the surface tension and stress of the solder acting to the upper area from the perpendicular bisector 8 is preferable smaller. Thus, the connection electrodes 4 may be placed close to the lower end area, and a total contact area of the connection electrodes 4 in the lower area and a substrate may be larger than a total contact area of the connection electrodes 4 in the upper area and the substrate. Further, the center of gravity of the area which is defined by the six connection electrodes 4 may be located lower than the perpendicular bisector 8.

The connection electrodes 4 are preferably arranged asymmetrically about the perpendicular bisector 8 and symmetrically about the center line 7. The position, number, size and shape of the connection electrodes 4 are not limited to those shown in FIG. 1A. For example, the connection electrodes 4 between the connection electrodes 4a and 4b may be eliminated so that total four electrodes 4 are formed. Further, the sizes and shapes of the connection electrodes 4a and 4b may be different from each other and the connection electrode 4b may be larger than the connection electrode 4a.

If the connection electrodes 4 are arranged symmetrically to the perpendicular bisector 8 and when mounting a semiconductor chip which is smaller than a maximum mount size, one way is to solder only the connection electrodes 4 and 4b without using the connection electrodes 4a. In this case, however, since the solder can flow into the connection electrodes 4a, appearance check is required. This causes lower yield and extra costs for applying soldering resist to prevent the solder from attaching.

Figure 2A:
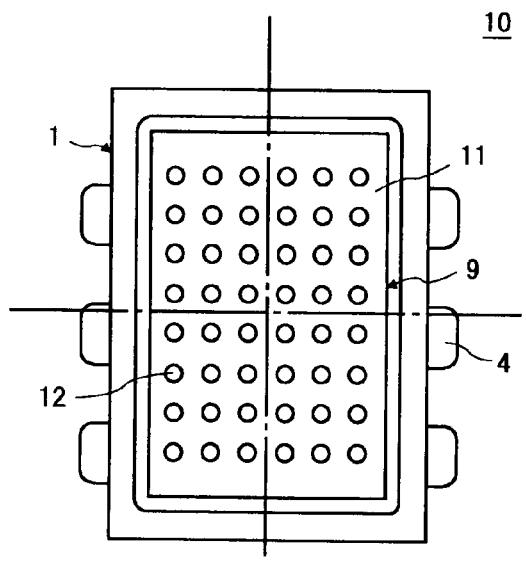
FIG. 2A is a plan view of a semiconductor device of the present invention.
Figure 2B:
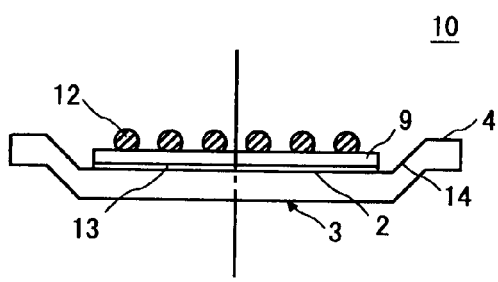
FIG. 2B is a sectional view of the semiconductor device of the present invention.

FIG. 2A is a plan view of a semiconductor device 10 where a semiconductor chip 9 with a maximum mount size is mounted to the package 1 which has the same structure as in FIG. 1. FIG. 2B is a sectional view of the same. The semiconductor chip 9 which is mounted on this package is a metal-oxide-semiconductor field-effect transistor (MOSFET). It has front surface electrodes 11 which are composed of source electrodes and gate electrodes. On the front surface electrodes 11, soldering bumps 12 are placed as a plurality of bump electrodes. For example, the plurality of soldering bumps 12 may be placed on a source electrode.

The semiconductor chip 9 further has rear surface electrodes 13 on the reverse side of the surface with the front surface electrode 11. The rear surface electrodes 13 are MOSFET drain electrodes and soldered to the chip mounting area 2 of the metal package base 3. In this embodiment, the semiconductor chip 9 with a maximum mount size which is slightly smaller than the chip mounting area 2 is mounted to the chip mounting area 2 of the metal package base 3.

In this structure, the four sides of the semiconductor chip 9 are fixed by being pulled in four directions because of solder surface tension which occurs with four inner surfaces 14 formed by the hollow of the chip mounting area 2 of the metal package base 3. This provides stable mounting position accuracy.

Figure 2C:
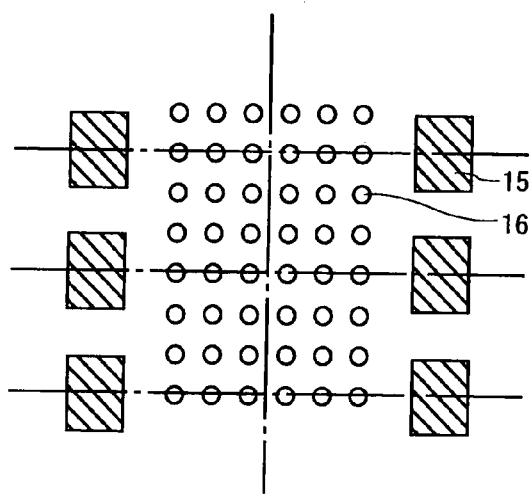
FIG. 2C is a plan view of the semiconductor device of the present invention.

FIG. 2C shows a mounting pattern of a soldering area when the semiconductor device 10 is soldered to the substrate in a face-down mounting configuration. It shows the contact area of the semiconductor device 10 and the substrate when the semiconductor device 10 is mounted to the substrate.

A total of soldering areas 15 of the connection electrodes 4 is substantially the same as a total of soldering areas 16 of the front surface electrodes 11. Thus, no great difference in fixation strength to the substrate exists between the front surface electrodes 11 and the connection electrodes 4. The six soldering areas 15 are arranged symmetrically, three in the left and three in the right, centering on the collective area of the plurality of soldering areas 16. Since the fixation strength of the connection electrodes 4 and the front surface electrodes 11, and their positions are well-balanced, no excess force acts on the mounting area of the front surface electrodes 11 and therefore no stress is left. This prevents the semiconductor device 10a from breaking down due to stress.

Second Embodiment

Figure 3A:
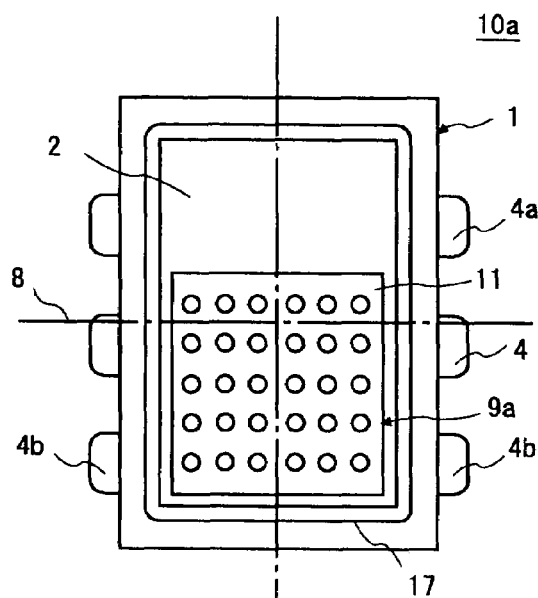
FIG. 3A is a plan view of a semiconductor device of the present invention.
Figure 3B:
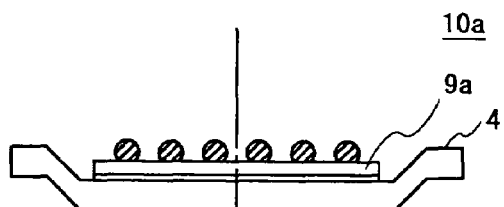
FIG. 3B is a sectional view of the semiconductor device of the present invention.

FIG. 3A is a plan view of a semiconductor device 10a where a semiconductor chip 9a which is smaller than a maximum mount size is mounted to the package 1, and FIG. 3B is a sectional view of the same. In the semiconductor device 10a, the semiconductor chip 9a which is smaller than the semiconductor chip of FIGS. 2A to 2C is mounted to the package 1 which has the same structure as in FIGS. 1A and 1B. If the horizontal direction of the semiconductor chip 9a in FIG. 3A is the width direction, the size in the width direction is the same as the maximum mount size, while the size in the length direction perpendicular to the width direction is as short as about 70% of the maximum mount size. The semiconductor chip 9a is mounted so as to be shifted closer to an end 17 of the chip mounting area 2, which is shown at the bottom in the plan view of FIG. 3A. Hence, the semiconductor chip 9a is mounted against the end 17 of the side where the connection electrodes 4b which are located farthest apart from the perpendicular bisector 8.

Figure 3C:
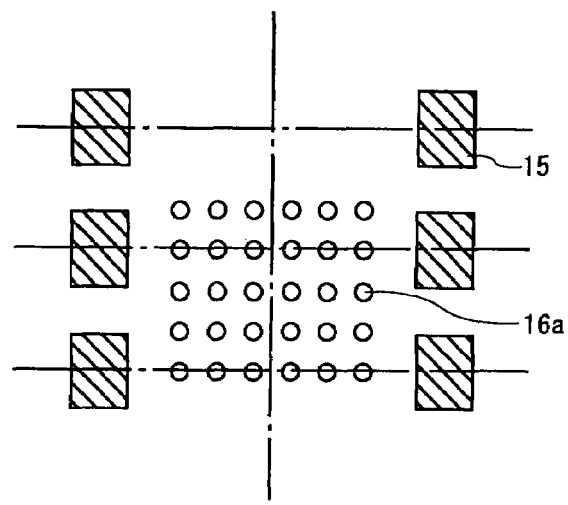
FIG. 3C is a plan view of the semiconductor device of the present invention.

FIG. 3C shows a mounting pattern of a soldering part when the semiconductor device 10a is soldered to the substrate in a face-down configuration. A total of the soldering areas 15 of the connection electrodes 4 is substantially the same as a total of soldering areas 16a of the front surface electrodes 11. Thus, no great difference in fixation strength to the substrate exists between the front surface electrodes 11 and the connection electrodes 4. The six soldering areas 15 has left-right symmetry, three in the left and three in the right, about the collective area of the plurality of soldering areas 16a. Since the fixation strength of the connection electrodes 4 and the front surface electrodes 11, and their positions are well-balanced, no excess force acts on the mounting area of the front surface electrodes 11 and therefore no stress is left. This prevents the semiconductor device 10a from breaking down due to stress.

Figure 4B:
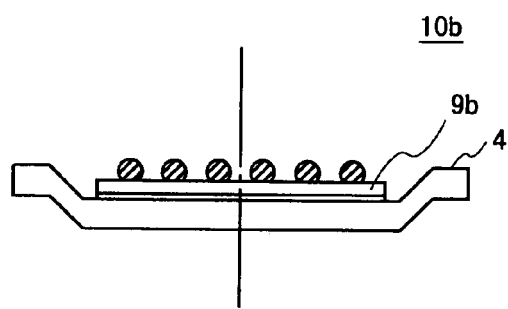
FIG. 4B is a sectional view of the semiconductor device of the present invention.

FIG. 4A is a plan view of a semiconductor device 10b where a semiconductor chip 9b which is still smaller than that of FIG. 3 is mounted to the package 1, and FIG. 4B is a sectional view of the same. In the semiconductor device 10b, the semiconductor chip 9b which is still smaller than the semiconductor chip of FIGS. 3A to 3C is mounted to the package 1 which has the same structure as in FIGS. 1A and 1B. If the horizontal direction of the semiconductor chip 9b in FIG. 4A is the width direction, the size in the width direction is the same as the maximum mount size, while the size in the length direction perpendicular to the width direction is as short as about 50% of the maximum mount size. The semiconductor chip 9b is mounted so as to be shifted to the end 17 of the chip mounting area 2, which is shown at the bottom of the plan view of FIG. 4A. Hence, the semiconductor chip 9b is mounted against the end 17 in the side where the connection electrodes 4b located farthest from the perpendicular bisector 8 are formed.

Figure 4C:
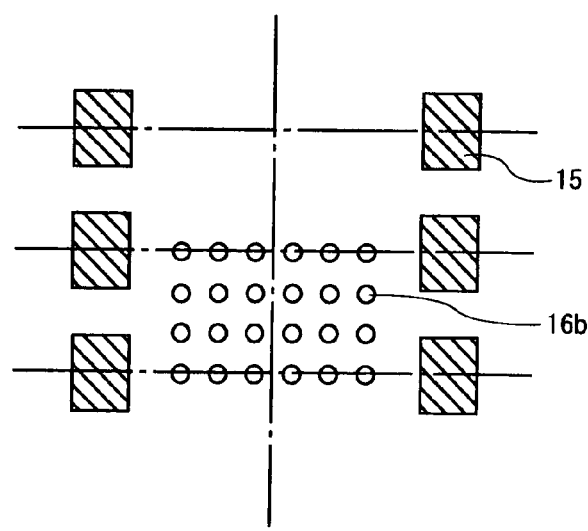
FIG. 4C is a plan view of the semiconductor device of the present invention.

FIG. 4C shows a mounting pattern of a soldering area when the semiconductor device 10b is soldered to the substrate in a face-down configuration. A total of the soldering areas 15 of the connection electrodes 4 is substantially the same as a total of soldering areas 16b of the front surface electrodes 11. Thus, no great difference in fixation strength to the substrate exists between the front surface electrodes 11 and the connection electrodes 4. The six soldering areas 15 has left-right symmetry, three in the left and three in the right, about the collective area of the plurality of soldering areas 16b. Since the fixation strength of the connection electrodes 4 and the front surface electrodes 11, and their positions are well-balanced, no excess force acts on the mounting area of the front surface electrodes 11 and therefore no stress is left. This prevents the semiconductor device 10a from breaking down due to the stress.

The present invention mounts to the same electronic package a variety of semiconductor chips where the length of one side (width direction) of the semiconductor chip is fixed and the length of the other side (length direction) is flexible. Even if the semiconductor chip is mounted in the position against one side of the chip mounting area in order to improve the mounting position accuracy, no stress is left in the mounting area of the semiconductor chip by balancing out the total areas and positions of the soldering areas when soldering the semiconductor chip to the substrate.

When the semiconductor device of this invention is soldered to the substrate in a face-down configuration, the soldering areas of the connection electrodes are arranged well-balanced so as to surround the soldering areas of the plurality of front surface electrodes, so that a total of the soldering areas of the connection electrodes and a total of the soldering areas of the front surface electrodes are substantially the same. No great difference in fixation strength to the substrate thereby exists between the front surface electrodes and the connection electrodes. Stress is therefore not likely to be left in the mounting area of the semiconductor chip, thus preventing the semiconductor device from breaking down due to stress.

In this structure, it is possible to prevent displacement due to a difference in surface tension from occurring when heating the solder, to prevent stress from being left when cooling the solder after heating, and further to suppress a force due to a difference in thermal expansion when temperature changes after mounting.

Further, since the present invention allows mounting the semiconductor chip with a maximum mount size to about half the maximum mount size, if the substrate is designed to fit the size of the package 1, no great change in lines of the substrate or the like is required when the size of the semiconductor chip is changed.

Third Embodiment

Figure 5A:
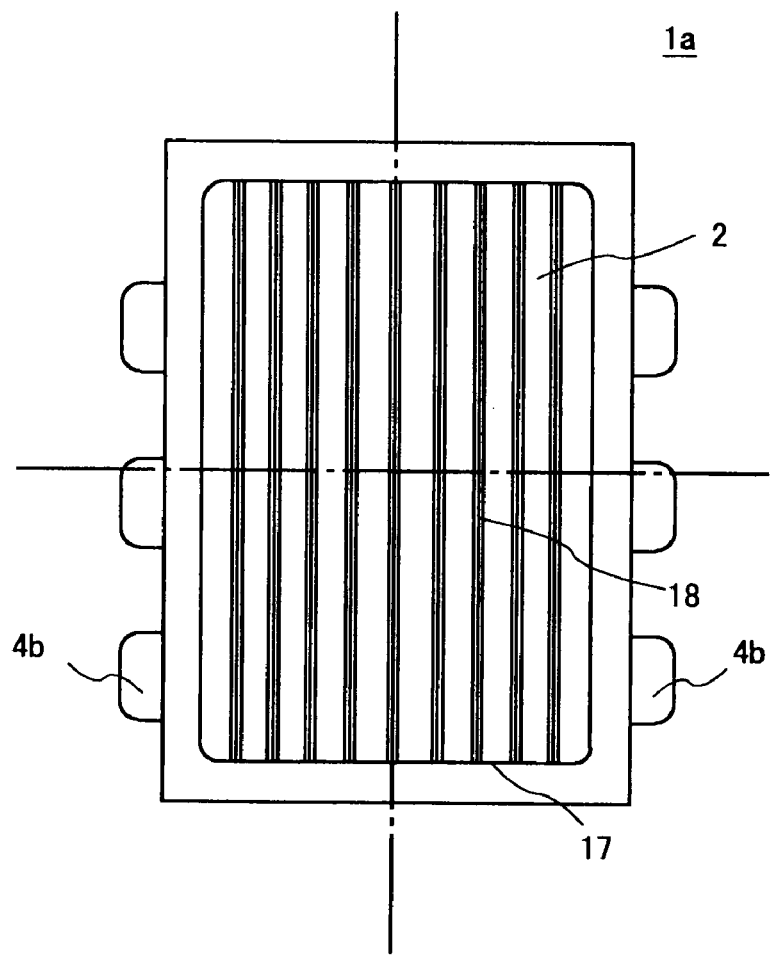
FIG. 5A is a plan view of a semiconductor device of the present invention.
Figure 5B:
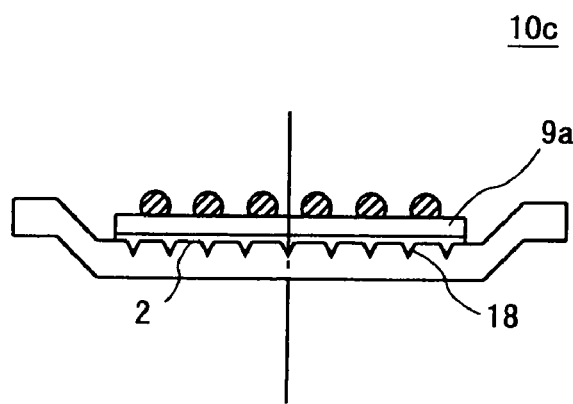
FIG. 5B is a sectional view of the semiconductor device of the present invention.

FIG. 5A is a plan view of a package for an electronic component 1a which has a V-shaped groove 18 in the chip mounting area 2. FIG. 5B is a sectional view of a semiconductor device 10c where the small semiconductor chip 9a is mounted to the package 1a.

If the surface of the chip mounting area 2 is flat, solder flows easily. This makes it difficult to draw the small semiconductor chip 9a to the position against the end 17 of the chip mounting area 2 since a melted solder layer cannot be kept to a given thickness or more. To overcome this drawback, this embodiment forms the V-shaped groove 18 as a depressed portion on the surface of the chip mounting area 2 as shown in FIG. 5A. The melted solder thereby remains in the groove 18, which enables to keep the solder layer to a given thickness or more. It is thereby possible to draw the semiconductor chip 9a to the position against the end 17 of the chip mounting area 2 easily.

The position, shape, size and so on of the groove 18 are not limited to those shown in FIGS. 5A and 5B. It is preferred that the solder layer is kept to a given thickness or more, and that friction resistance between the semiconductor chip 9a and the surface of the chip mounting area 2 is small when shifting the semiconductor chip 9a to the end position. Further, the groove 18 preferably extends along the shifting direction, that is the direction toward the end 17, and extends along the direction perpendicular to the shifting directions well.

Figure 6A:
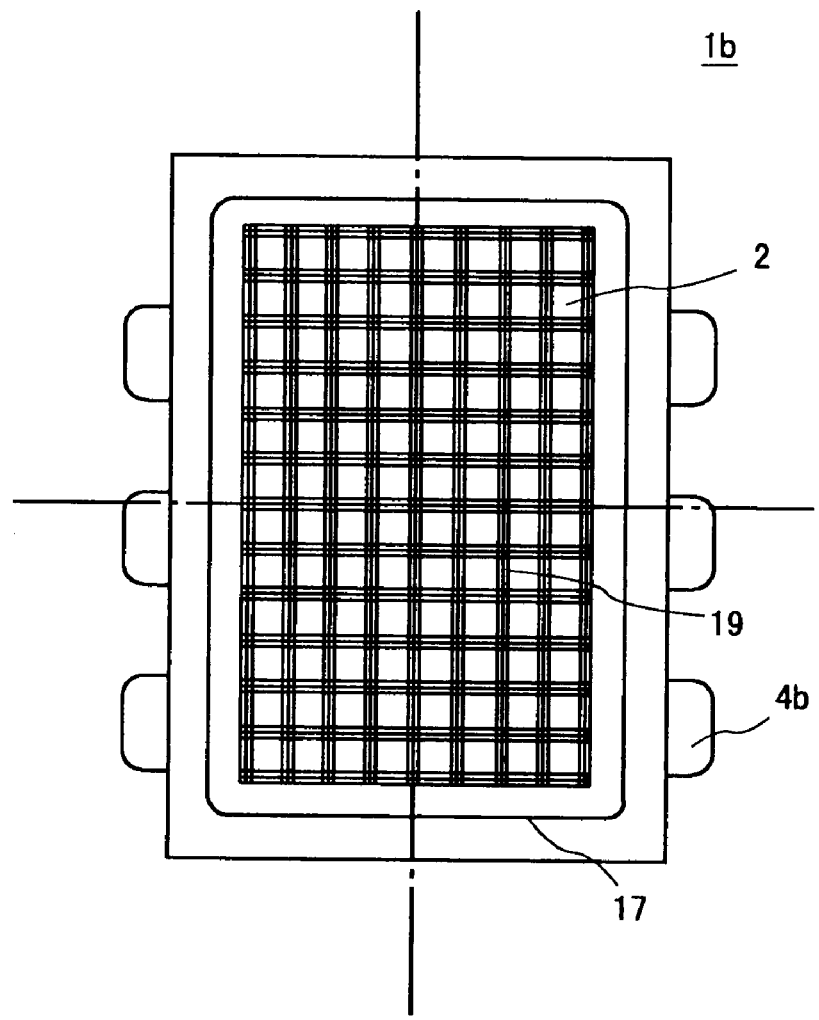
FIG. 6A is a plan view of a semiconductor device of the present invention.
Figure 6B:
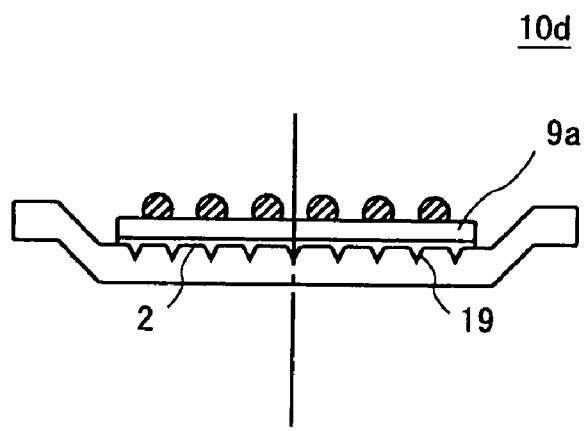
FIG. 6B is a sectional view of the semiconductor device of the present invention.

FIG. 6A is a plan view of a package for an electronic component 1b which has V-shaped grooves 19 in a lattice pattern on the chip mounting area 2. FIG. 6B is a sectional view of a semiconductor device 10d where the semiconductor chip 9a is mounted to the package 1b. The V-shaped grooves 19 extend along the direction toward the end 17 and also along the direction perpendicular to the direction toward the end 17. This structure has the same effect as in FIG. 5.

Figure 7A:
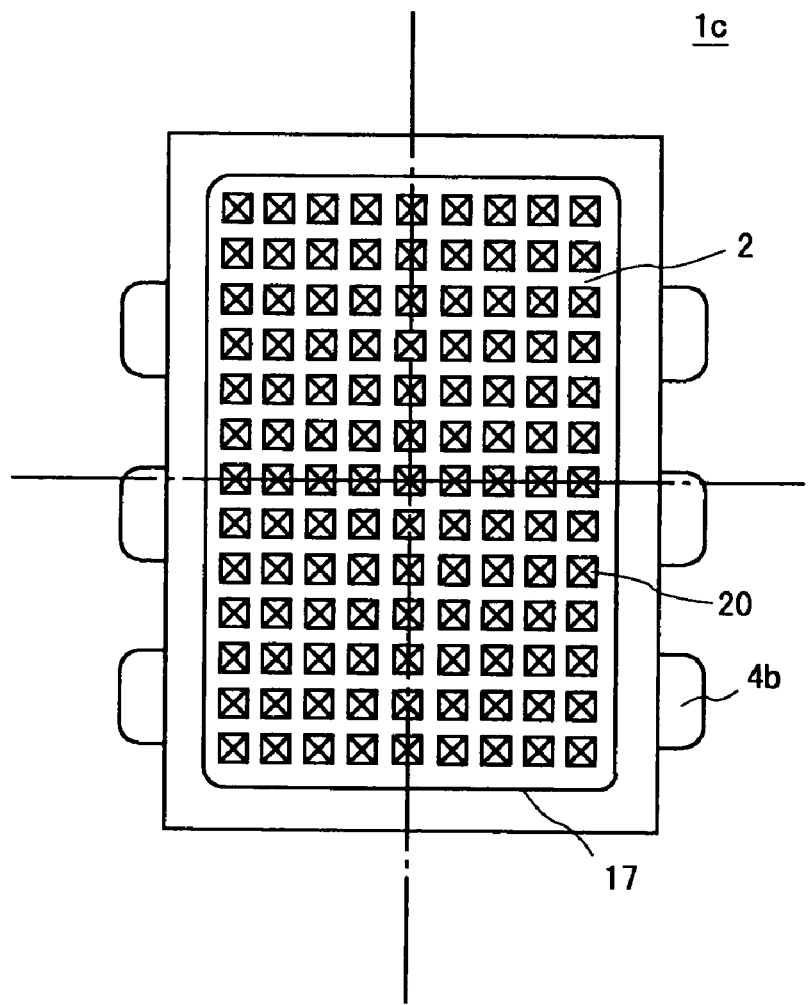
FIG. 7A is a plan view of a semiconductor device of the present invention.
Figure 7B:
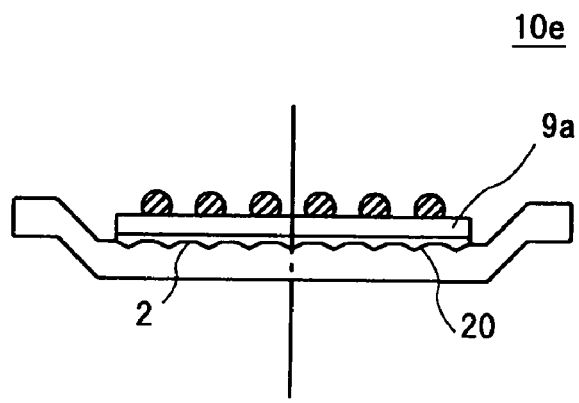
FIG. 7B is a sectional view of the semiconductor device of the present invention.
Figure 8:
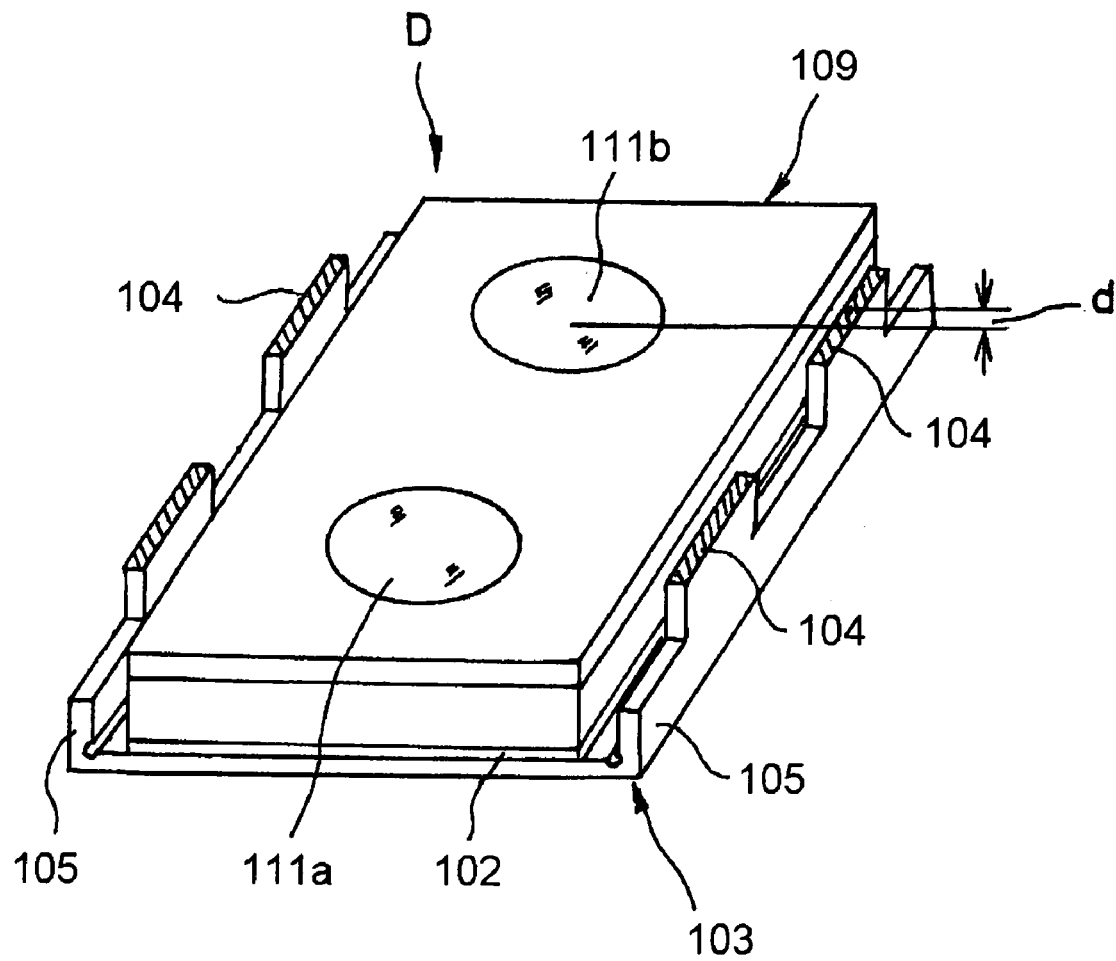
FIG. 8 is a perspective view of a semiconductor device of a related art.
Figure 9:
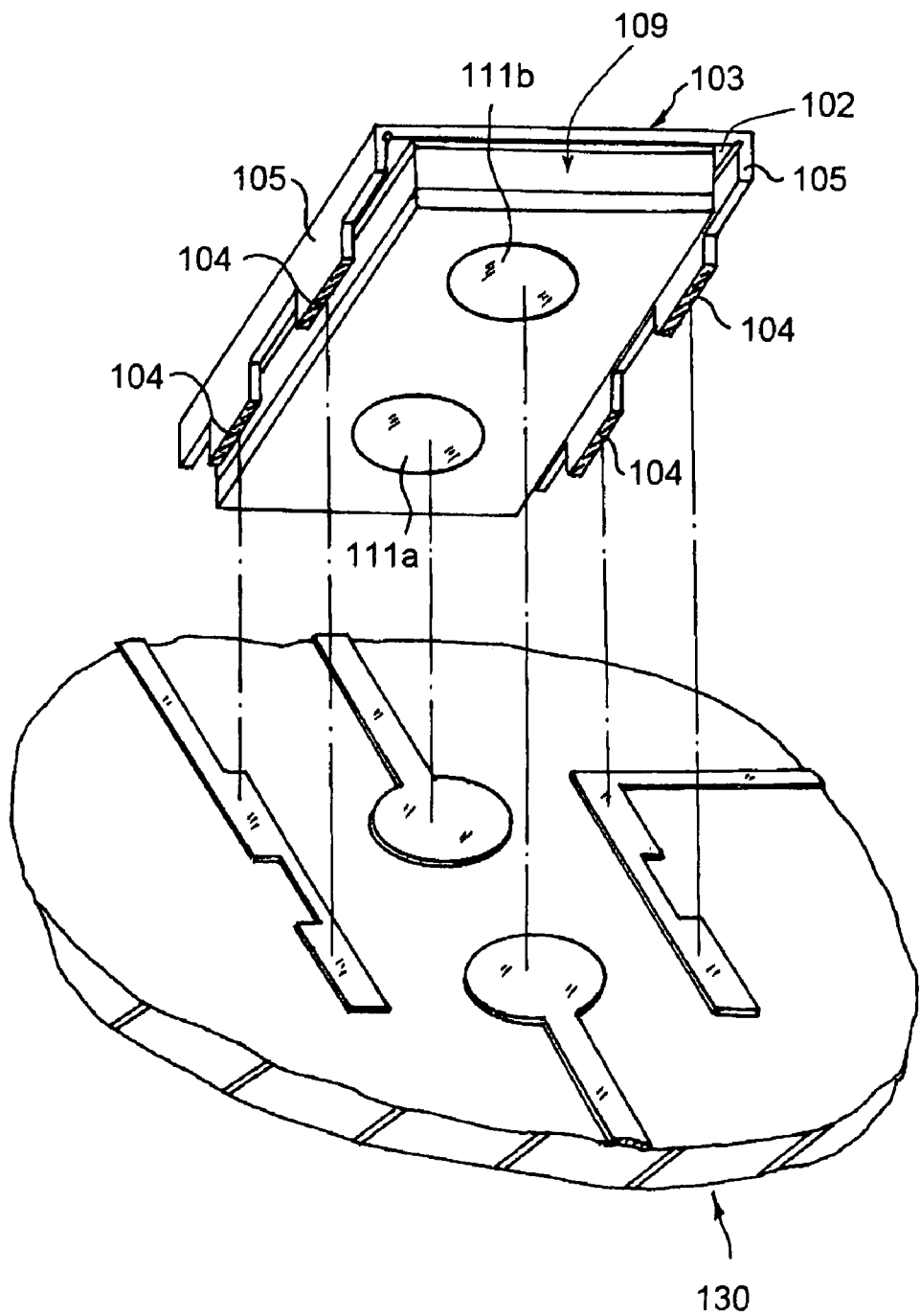
FIG. 9 is a perspective view to describe the mounting structure of the semiconductor device of the related art.
Figure 10:
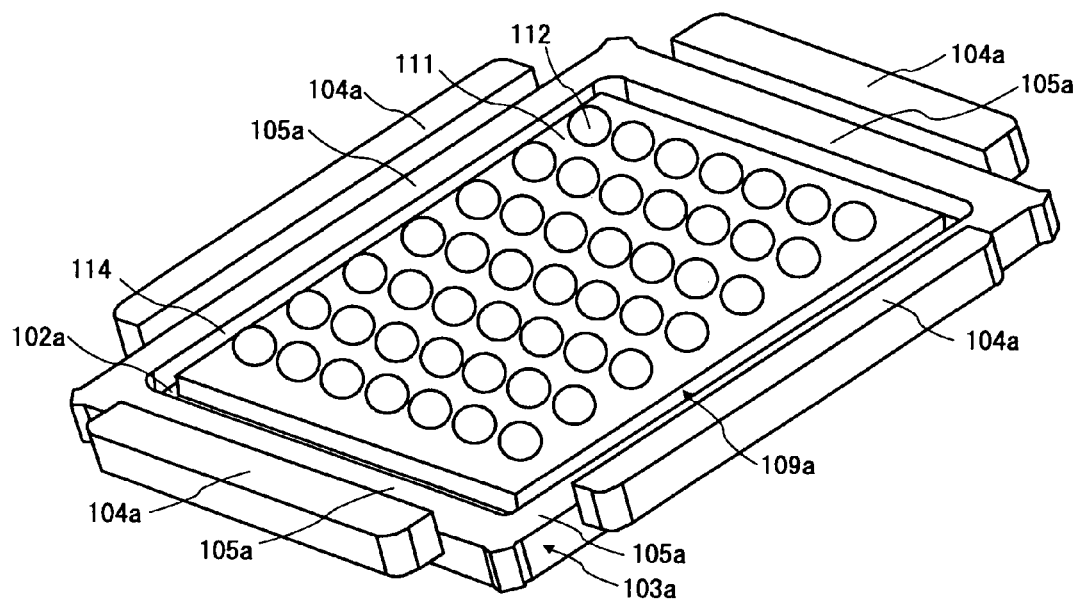
FIG. 10 is a perspective view of a semiconductor device of a related art.

FIG. 7A is a plan view of a package for an electronic component 1c which has a bottom inner surface like a waffle with U-shaped depressed portions 20 on the chip mounting area 2. FIG. 7B is a sectional view of a semiconductor device 10e where the semiconductor chip 9a is mounted to the package 1c. The U-shaped depressed portions 20 are arranged in matrix layout. Thus, the U-shaped depressed portions 20 are formed along the direction to the end 17 and also along the direction perpendicular to the direction to the end 17. This structure has the same effect as in FIG. 5.

As described above, by forming a plurality of grooves on the surface of a chip mounting area of a package for an electronic component, melted solder remains in the grooves, which enables to keep a solder layer to a given thickness or more. Further, a contact area of the semiconductor chip and the chip mounting area surface is smaller in this structure, which reduces the friction resistance when drawing the semiconductor chip to the end position. It is thereby possible to draw the semiconductor chip to the end of the chip mounting area easily.

Although the above embodiments describe the case of applying this invention to MOSFET, the invention is also applicable to semiconductor devices which have other semiconductor chips such as a bipolar transistor, diode, and IC.

It is apparent that the present invention is not limited to the above embodiment that may be modified and changed without departing from the scope and spirit of the invention.

What is claimed is:

1. A package for an electronic component formed using a rectangular metal plate, comprising:
    a first plurality of connection electrodes formed on a first side of said rectangular metal plate;
    a second plurality of connection electrodes formed on a second side of said rectangular metal plate, said second side being parallel with said first side; and
    a chip mounting area formed between said first and second sides of said rectangular metal plate,
    wherein said rectangular metal plate is divided into a first portion and a second portion by a perpendicular bisector of said first side and said second side of said rectangular metal plate, said first plurality of connection electrodes and said second plurality of connection electrodes are arranged asymmetrically about said perpendicular bisector, a first total soldering area of said first plurality of connection electrodes and said second plurality of connection electrodes formed on said first portion is smaller than a second total soldering area of said first and said second plurality of connection electrodes formed on said second portion.

2. The package for an electronic component of claim 1, wherein said first plurality connection electrodes and said second plurality of connection electrodes are arranged symmetrically about a line along said first side and said second side.

3. The package for an electronic component of claim 1, wherein said first total soldering area and said second total soldering area are arranged symmetrically about a line along said first side and said second side.

4. The package for an electronic component of claim 1, wherein said chip mounting area is formed in a hollow part of said rectangular metal plate.

5. The package for an electronic component of claim 1, wherein a surface of said chip mounting area has a V-shaped depressed portion.

6. The package for an electronic component of claim 1, wherein a surface of said chip mounting area has a U-shaped depressed portion.

7. The package for an electronic component of claim 1, further comprising a semiconductor chip mounted on said chip mounting area.

8. The package for an electronic component of claim 7, wherein said semiconductor chip is placed in near proximity to at least three sides of the rectangular metal plate.

9. The package for an electronic component of claim 7, wherein the semiconductor chip has a front surface electrode on a front surface, a rear surface electrode on a rear surface, and said rear surface electrode and said chip mounting area are bonded together.

10. The package for an electronic component of claim 9, wherein said semiconductor chip comprises a metal-oxide-semiconductor field-effect transistor having a source electrode and a gate electrode on said front surface and a drain electrode on said rear surface.

11. The package for an electronic component of claim 7, wherein a major part of said semiconductor chip is mounted in said second portion of said rectangular metal plate.

12. The package for an electronic component of claim 7, further comprising a plurality of surface electrodes formed on a surface of said semiconductor chip.

13. The package for an electronic component of claim 12, wherein a total soldering area of said plurality of surface electrodes formed on said surface of said semiconductor chip equals a total of said first total soldering area and said second total soldering area of said first and second plurality of connection electrodes.

\* \* \* \* \*